United States Patent
Jenkins et al.

(10) Patent No.: US 10,162,395 B2
(45) Date of Patent: Dec. 25, 2018

(54) DEVICE SANDWICH STRUCTURED COMPOSITE HOUSING

(71) Applicant: Microsoft Technology Licensing, LLC, Redmond, WA (US)

(72) Inventors: Kurt A. Jenkins, Sammamish, WA (US); Edward Burress, West Linn, OR (US); Jaya Narain, Redmond, WA (US); Robert J. Bergeson, Taylors, SC (US); Andrew W. Hill, Redmond, WA (US); Taylor Stellman, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/380,274

(22) Filed: Dec. 15, 2016

(65) Prior Publication Data

US 2017/0097665 A1    Apr. 6, 2017

Related U.S. Application Data

(62) Division of application No. 14/603,142, filed on Jan. 22, 2015, now Pat. No. 9,575,523.

(51) Int. Cl.
*H05K 7/20* (2006.01)
*H01L 23/367* (2006.01)
(Continued)

(52) U.S. Cl.
CPC ............ *G06F 1/203* (2013.01); *G06F 1/1626* (2013.01); *G06F 1/1643* (2013.01); *G06F 1/1658* (2013.01); *G06F 3/045* (2013.01); *G06F 3/0412* (2013.01); *H01L 23/3675* (2013.01); *H01L 23/3735* (2013.01); *H01L 23/4006* (2013.01);
(Continued)

(58) Field of Classification Search
CPC ................. H01L 23/3675; H05K 7/20436
See application file for complete search history.

(56) References Cited

U.S. PATENT DOCUMENTS 4,768,286 A * 9/1988 Ketcham ................ H05K 3/284
                                                 29/841
5,054,193 A * 10/1991 Ohms ................... H05K 3/3415
                                                 269/21
(Continued)

FOREIGN PATENT DOCUMENTS

| CN | 103298321 A | 9/2013 |
|---|---|---|
| EP | 2075993 A1 | 7/2009 |
| WO | 2013187298 A1 | 12/2013 |

OTHER PUBLICATIONS

Notice of Allowance dated Oct. 31, 2016 from U.S. Appl. No. 14/603,142, 17 pages.
(Continued)

*Primary Examiner* — Robert J Hoffberg
(74) *Attorney, Agent, or Firm* — Rainier Patents, P.S.

(57) ABSTRACT

The description relates to devices, such as computing devices. One example can include a sandwich structured composite housing. The example can also include a set of electronic components positioned over the sandwich structured composite housing. The set of electronic components can have a profile against the sandwich structured composite housing. The sandwich structured composite housing can have a corresponding negative profile.

21 Claims, 9 Drawing Sheets

(51) Int. Cl.
  *G06F 1/20* (2006.01)
  *G06F 1/16* (2006.01)
  *G06F 3/041* (2006.01)
  *G06F 3/045* (2006.01)
  *H01L 23/373* (2006.01)
  *H01L 23/40* (2006.01)

(52) U.S. Cl.
  CPC ....... *H05K 7/2039* (2013.01); *H05K 7/20436* (2013.01); *G06F 3/041* (2013.01); *H01L 2023/4068* (2013.01); *H01L 2924/0002* (2013.01)

(56) References Cited

U.S. PATENT DOCUMENTS

| | | | | |
|---|---|---|---|---|
| 5,208,733 | A | * | 5/1993 | Besanger ............... H05K 3/284 165/185 |
| 5,581,443 | A | | 12/1996 | Nakamura et al. |
| 5,650,662 | A | | 7/1997 | Edwards et al. |
| 5,825,625 | A | | 10/1998 | Esterberg et al. |
| 6,570,086 | B1 | * | 5/2003 | Shimoji ............. H05K 7/20445 174/377 |
| 6,816,377 | B2 | * | 11/2004 | Itabashi ................. H05K 7/205 174/252 |
| 7,072,185 | B1 | * | 7/2006 | Belady ................... G06F 1/189 257/E23.105 |
| 7,310,233 | B2 | * | 12/2007 | Bell ................... H05K 7/20509 165/185 |
| 7,470,982 | B2 | * | 12/2008 | Takashima ........... H01L 23/053 257/706 |
| 7,486,517 | B2 | * | 2/2009 | Aapro .................. H04M 1/026 165/104.33 |
| 7,965,514 | B2 | | 6/2011 | Hill et al. |
| 7,969,730 | B1 | | 6/2011 | Doherty et al. |
| 8,077,479 | B2 | | 12/2011 | Ligtenberg |
| 8,361,668 | B2 | | 1/2013 | McLean et al. |
| 8,564,943 | B2 | | 10/2013 | Atkinson |
| 8,587,945 | B1 | | 11/2013 | Hartmann et al. |
| 8,673,471 | B2 | | 3/2014 | Yokoyama et al. |
| 8,804,331 | B2 | | 8/2014 | Refai-Ahmed |
| 8,879,269 | B2 | | 11/2014 | Hill et al. |
| 9,317,079 | B2 | * | 4/2016 | Burton ...................... G06F 1/20 |
| 9,575,523 | B2 | * | 2/2017 | Jenkins .................. G06F 1/203 |
| 2003/0161132 | A1 | * | 8/2003 | Shimoji ................ H01L 23/433 361/800 |
| 2006/0133042 | A1 | | 6/2006 | Belady et al. |
| 2008/0151503 | A1 | | 6/2008 | Aapro et al. |
| 2008/0158817 | A1 | | 7/2008 | Tsunoda et al. |
| 2011/0073294 | A1 | | 3/2011 | MacDonald et al. |
| 2013/0319640 | A1 | | 12/2013 | Cavallaro et al. |
| 2014/0069622 | A1 | | 3/2014 | Chen et al. |
| 2014/0240921 | A1 | | 8/2014 | Sultenfuss et al. |
| 2015/0163958 | A1 | * | 6/2015 | Oguma .............. H05K 7/20463 264/36.22 |
| 2016/0216748 | A1 | | 7/2016 | Jenkins et al. |

OTHER PUBLICATIONS

Corrected Notice of Allowability dated Jan. 11, 2017 from U.S. Appl. No. 14/603,142, 6 pages.
Corrected Notice of Allowability dated Jan. 26, 2017 from U.S. Appl. No. 14/603,142, 6 pages.
International Preliminary Report on Patentability dated Mar. 31, 2017 from PCT Patent Application No. PCT/US2016/013814, 6 pages.
"i.MX 6 Series Thermal Management Guidelines", Nov. 2012, Retrieved on Aug. 21, 2015 at <<http://cache.freescale.com/files/32bit/doc/app_note/AN4579.pdf>>, 90 pages.
International Search Report and Written Opinion dated Apr. 29, 2016 from PCT Patent Application No. PCT/US2016/013814, 12 pages.
Smalc et al., "Thermal Performance of Natural Graphite Heat Spreaders", Advances in Electronic Packaging, Proceedings of IPACK2005, ASME InterPACK'05, Jul. 17-22, 2005, pp. 1-11, 11 pages.
Response and Demand filed Nov. 21, 2016 from PCT Patent Application No. PCT/US2016/013814, 12 pages.
Second Written Opinion dated Dec. 14, 2016 from PCT Patent Application No. PCT/US2016/013814, 5 pages.

* cited by examiner

DEVICE SANDWICH STRUCTURED COMPOSITE HOUSING

BACKGROUND

The description relates to devices, such as computing devices, and to housings for devices.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

DESCRIPTION

The present concepts relate to devices, such as computing devices. For many form factors, such as tablets, notebooks, and/or wearable devices, consumer preferences are toward smaller form factors, especially thinner and/or lighter form factors. At the same time, consumers want high compute performance. The high performance tends to result in unwanted heat generation. Removing heat from the source within devices becomes increasingly difficult with thinner devices. In many cases, venting has been removed for aesthetic reasons, as well as the difficulty involved with getting airflow through a thin device tightly packed with components. Current technology utilizes conductive materials such as aluminum, copper, and pyrolytic graphite to remove heat from the source and move it to another area. Structures are laminated with these conductive materials with the idea of removing heat from one area and distributing it evenly over a broader area. This can still create "hot spots" in the customer's hands and is undesirable. Some of the present concepts provide higher heat transfer efficiency and/or the ability to move heat from one surface to another within a device.

Figure 1:
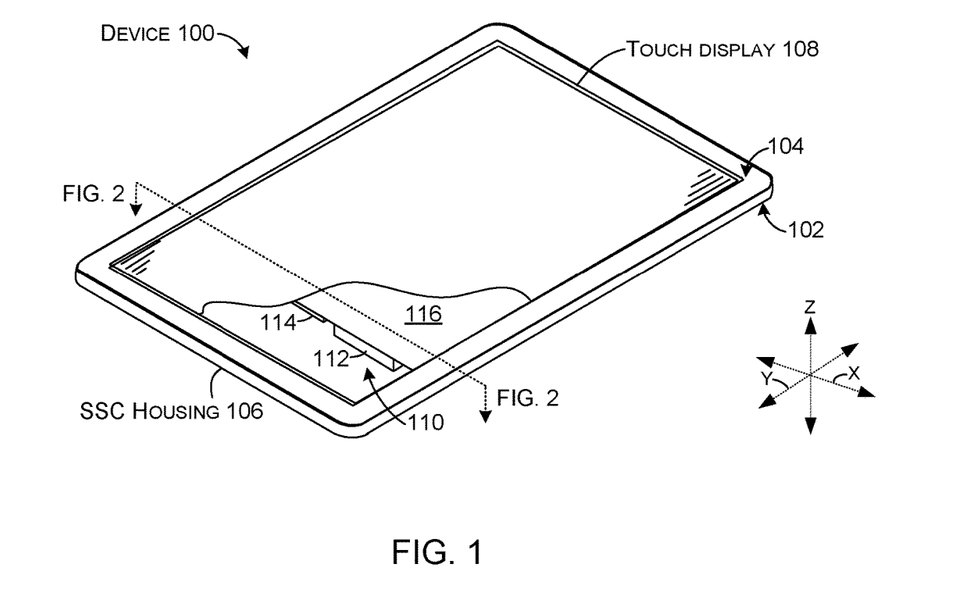
FIG. 1 is a partial cutaway perspective view of an example device that can include the present sandwich structured composite housing implementations in accordance with the present concepts.
Figure 2:
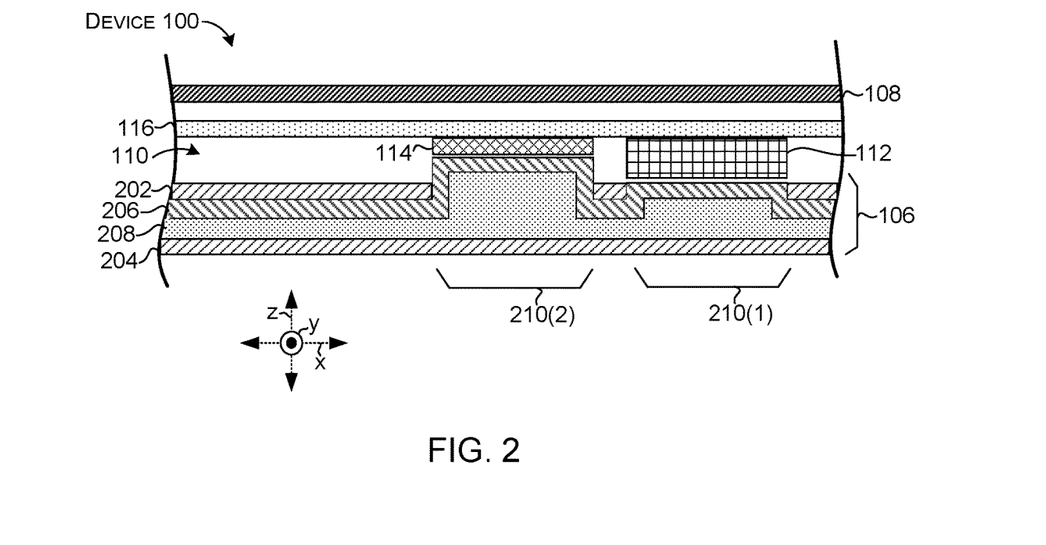
FIGS. 2-4 are sectional views of example devices that can include the present sandwich structured composite housing implementations in accordance with the present concepts.

FIGS. 1-2 show an example device 100 manifest as a tablet type computing device. FIG. 1 shows a partial cutaway view of device 100. FIG. 2 is a sectional view through device 100 as indicated in FIG. 1. The device 100 can include first and second portions 102 and 104. In this example, the first portion is manifest as a sandwich structured composite housing 106 and the second portion is manifest as a display screen, such as a touch display 108. Computing device 100 can also include a set of heat generating electronic components 110. In this example, the set of electronic components can include processor 112 and memory 114. In this implementation, the processor 112 and memory 114 are secured to a printed circuit board 116 that can include other electronic components. In some cases, the set of electronic components 110 can be positioned within the sandwich structured composite housing 106 with the touch display 108 positioned on top. Accordingly, in such instances the sandwich structured composite housing 106 is sometimes referred to as a 'bucket.'

As can be appreciated from FIG. 2, sandwich structured composite housing 106 can include inner and outer structural layers 202 and 204 as well as interposed thermal conductive and thermal insulative layers 206 and 208, respectively. In this implementation, rather than being continuous, the inner structural layer 202 can define windows 210 proximate to (e.g., beneath or along the z reference axis) individual heat generating electronic components. For example, window 210(1) is located beneath processor 112 and window 210(2) is located beneath memory 114. The windows 210 can allow the thermal conductive layer 206 to be extended toward (e.g., closer to) the heat generating electronic components 110 (e.g., in the positive z reference direction).

In the case of processor 112, the processor extends quite far toward the sandwich structured composite housing 106 in the z reference direction. Responsively, the thermal conductive layer 206 is extended upward in the z direction until the thermal conductive layer 206 is approximately flush with an upper surface of inner structural layer 202. The thermal conducting layer can be configured to physically touch the processor or a small gap can be designed to accommodate manufacturing tolerances. In this configuration, the processor 112 can readily transfer heat to the thermal conductive layer 206.

In the case of the memory 114, the thermal conductive layer 206 is extended beyond the inner structural layer 202 (e.g., 'proud' to the inner structural layer) to be in close proximity to the memory for efficient heat transfer. Stated another way, extending the thermal conductive layer 206 toward the heat generating components can increase an amount of heat energy per unit time that can be transferred from the electronic components 110 by the thermal conductive layer 206. Further, the thermal conductive layer 206 can be configured to dissipate this captured heat energy laterally over a large portion of the device 100.

Stated another way, the thermal conductive layer 206 can be configured to efficiently move heat away from the heat generating components in the x and y reference directions rather than simply transferring the heat to the directly underlying portion of the outer structural layer 204. Viewed from one perspective, in some implementations, the thermal conductive layer can be anisotropic or can be more efficient at conveying thermal energy parallel to a planar region (e.g., parallel to the xy reference plane than perpendicular to the planar region (e.g., the z reference direction)). Thus, the structure of the sandwich structured composite housing 106 contributes to efficient heat removal from the heat generating electronic components 110 so that these components do not fail prematurely. Further, the removed heat is efficiently distributed laterally (e.g., in the x and y reference directions) by the thermal conductive layer 206. The distributed heat is finally conducted from the thermal conductive layer 206 through the thermal insulative layer 208 to the outer structural layer 204 so that the outer structural layer is more evenly 'warm' rather than having hot spots directly under the heat generating electronic components.

For purposes of discussion, the sandwich structured composite housing 106 can be thought of as having a generally planar region in the xy reference plane that approximately corresponds to and underlies the touch display 108. The term 'generally' is used since (as is evident in FIG. 2) portions of the thermal conductive layer 206 extend through the plane when the plane is defined by the inner structural layer 202. While some implementations may be generally planar, the concepts are equally applicable to non-planar implementations, such as curved smart phones, curved TVs, curved wearables, etc.

Figure 3:
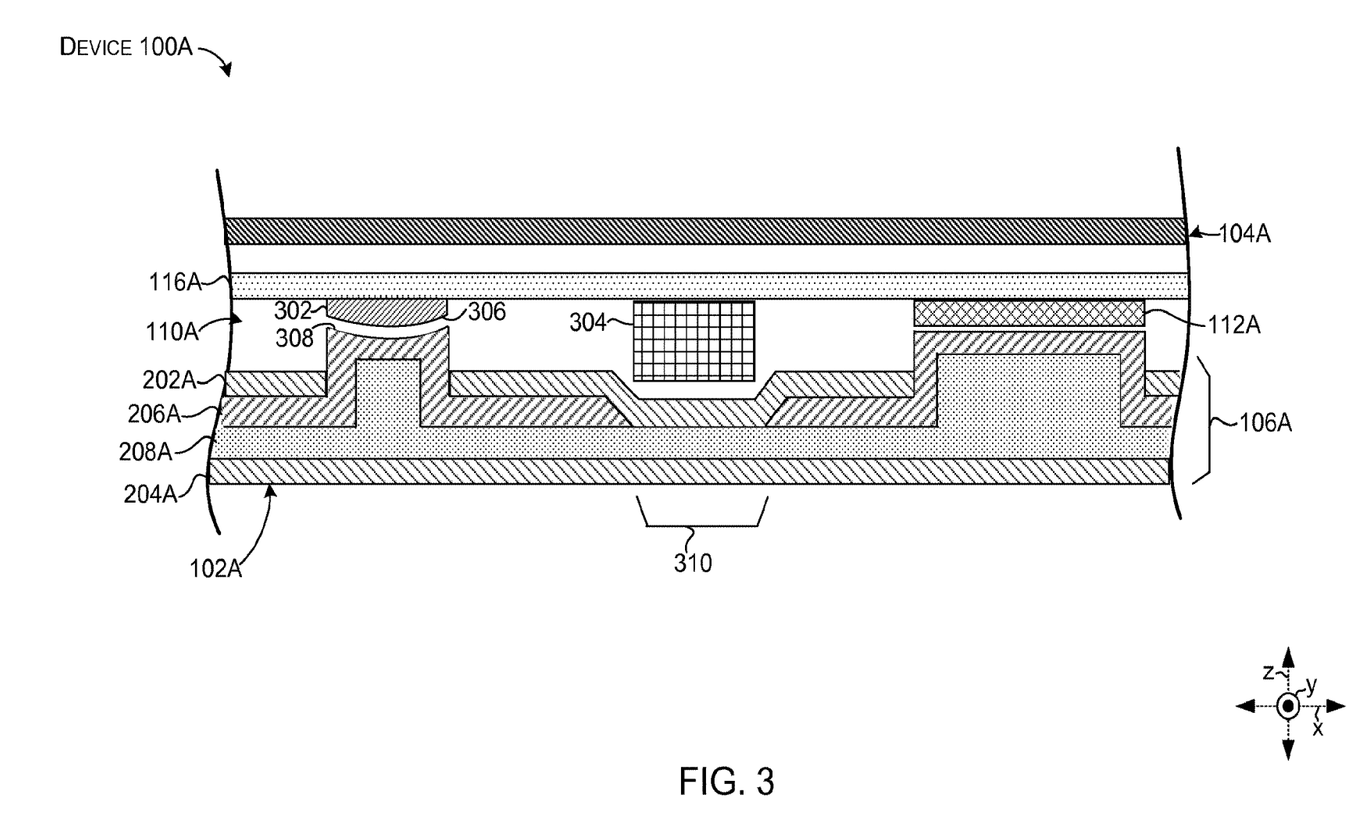

FIG. 3 shows another device 100A that includes first and second portions 102A and 104A. In this example, the first portion 102A is manifest as sandwich structured composite housing 106A. The set of electronic components 110A can include a general processor (e.g., CPU) 112A, a graphics processor (e.g., GPU) 302, and wireless circuitry 304, each of which is coupled to printed circuit board 116A. Note that the graphics processor 302 has a curved surface 306 facing toward the sandwich structured composite housing 106A. Note further, that a corresponding upper facing surface 308 of the thermal conductive layer 206A is shaped in an opposite manner (e.g., corresponding negative shape) to allow effective heat transfer from the graphics processor 302 to the thermal conductive layer 206A. Note further that in this instance, the wireless circuitry 304 does not generate large amounts of heat, but structurally extends relatively far in the −z reference direction such that it would contact the inner structural layer 202A. In this case, the thermal conductive layer 206A is omitted below the wireless circuitry 304 as indicated at 310 and the inner structural layer 202 extends down into the space that would otherwise be occupied by the thermal conductive layer 206A. This configuration can create sufficient clearance between individual electronic components and the sandwich structured composite housing 106A. In this case, the bulk (e.g., z direction dimensions) of the wireless circuitry 304 would normally cause a thickness of the device to have to be increased, but the present implementations allow adaption of the bucket to accommodate the z direction dimensions of the wireless circuitry 304.

Figure 4:
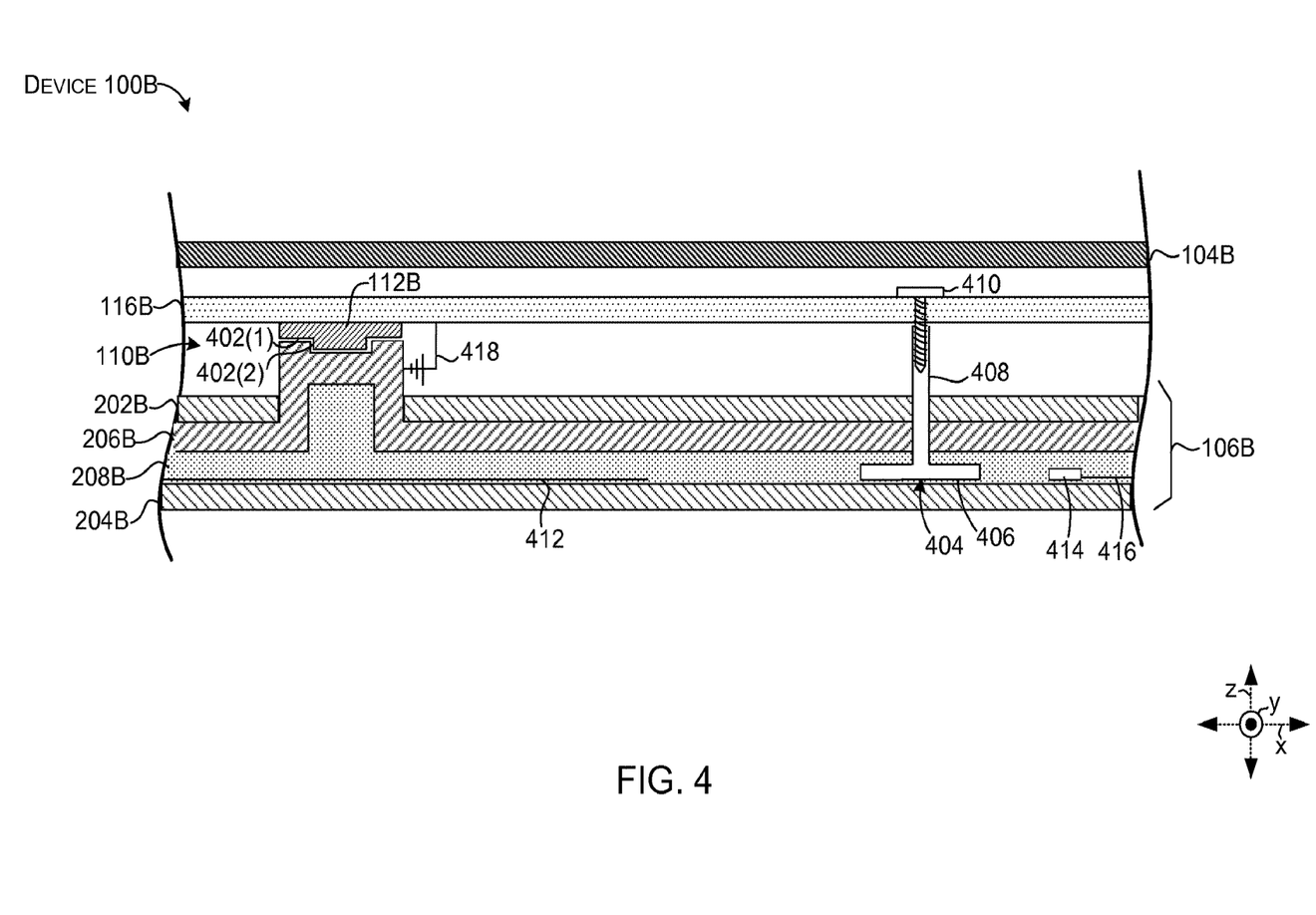

FIG. 4 shows another device 100B. In this case, the thermal conductive layer 206B is shaped to be positioned against multiple surfaces 402 (e.g., a generally horizontal surface 402(1) and a generally vertical surface 402(2)) of processor 112B. Also, in device 100B a structural component 404 is embedded in the sandwich structured composite housing 106B. In this configuration, the structural component 404 includes a horizontally expanded base portion 406 (e.g. extends in the xy reference plane) located in the thermal insulative layer 208B and a vertical stem region 408 extending through the inner structural layer 202B toward the printed circuit board 116B. In this case, the structural component 404 can facilitate fastening the sandwich structured composite housing 106B to printed circuit board 116B or other elements. For instance, in the illustrated configuration, the structural component 404 is threaded to receive a fastener 410 through the printed circuit board 116B. Of course, other types of fasteners can be employed and/or the structural component 404 can be utilized in other ways and/or have other configurations.

Device 100B also includes electronic components within the thermal insulative layer 208B or otherwise within the sandwich structured composite housing 106B. In one case, an individual electronic component 412 is manifest as an electrical conductor, such as a trace, that can electrically connect the printed circuit board to another element (not specifically shown). Alternatively, this electronic component 412 could function as an antenna. Another individual electronic component is manifest as a sensor 414 positioned within the sandwich structured composite housing 106B, in this this case within the thermal insulative layer 208B and against the outer structural layer 204B. The sensor 414 could be configured to sense conditions, such as pressure, through the outer structural layer 204B. The sensor 414 can be electrically connected to the printed circuit board via a trace 416, through various mechanisms, such as at the side of the structured composite housing 106B. The sandwich structured composite housing 106B can provide a very secure environment for these electronic components 412-416 so that they are secure from physical damage, water, corrosion, etc.

In this implementation, the printed circuit board 116B can be readily grounded to portions of the thermal conductive layer 206B that are proud to (e.g., extend beyond) the inner structural layer 202B as indicated at 418.

FIGS. 5-10 illustrate example processes for forming device 100A of FIG. 3. FIG. 11 shows a similar device. FIGS. 12-15 illustrate example processes for forming device 100B of FIG. 4. Further, FIGS. 5-15 include additional discussion about some of the elements of these devices.

Figure 5:
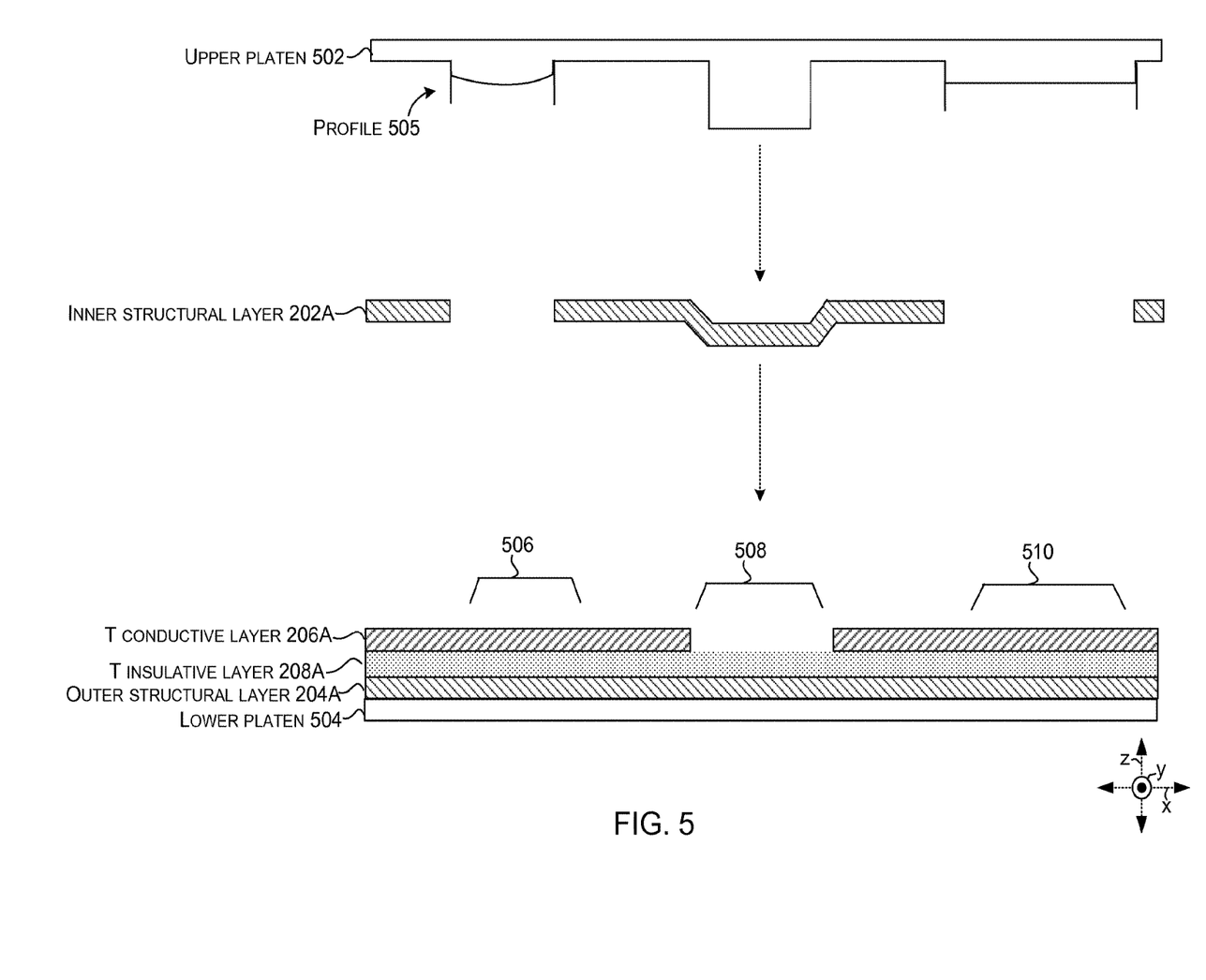
FIGS. 5 and 8-15 are sectional views of sandwich structured composite housing formation processes in accordance with the present concepts.

Looking at FIG. 5, in some implementations, the assembly process can be accomplished with the aid of upper and lower platens or molds 502 and 504. In this example, the lower platen 504 is generally planar (e.g., has a linear profile) and the upper platen 502 approximates a portion of a profile 505 of the set of electronic components 110A (see FIG. 3 and compare to FIG. 5).

In this case, outer structural layer 204A is positioned over the lower platen 504. The outer structural layer can be formulated of various materials, such as metals or non-metals. Examples of metals can include, but are not limited to, copper, aluminum, magnesium, etc. Where metals are employed, the structured composite housing 106A can be thought of as a metal composite material housing. The metal composite material housing can be thought of as a type of sandwich formed from two thin skins of metal bonded by interposed thermal insulative materials under controlled pressure, heat, and/or tension conditions. Examples of non-metals that can be utilized for the inner and/or outer structural layers can include, but are not limited to, plastics, polymers, and composites. The outer structural layer 204A can be formed in various ways, such as by deposition. In one implementation, the outer structural layer 204A is manifest as a metal foil or sheet that is positioned over the lower platen 504.

The thermal insulative layer 208A can be positioned over the outer structural layer 204A. The thermal insulative layer can be formulated from various materials, such as polypropylene. As will be explained below, in some implementations, the thermal insulative layer can have both thermal insulative and bonding properties. These properties are discussed below relative to FIG. 9. The thermal insulative layer can be formed in various ways. For instance, the thermal insulative layer can be manifest as a sheet of material that is placed over the outer structural layer 204A. In another example, the thermal insulative layer can be deposited on the outer structural layer 204A, such as by spraying or printing.

Figure 6:
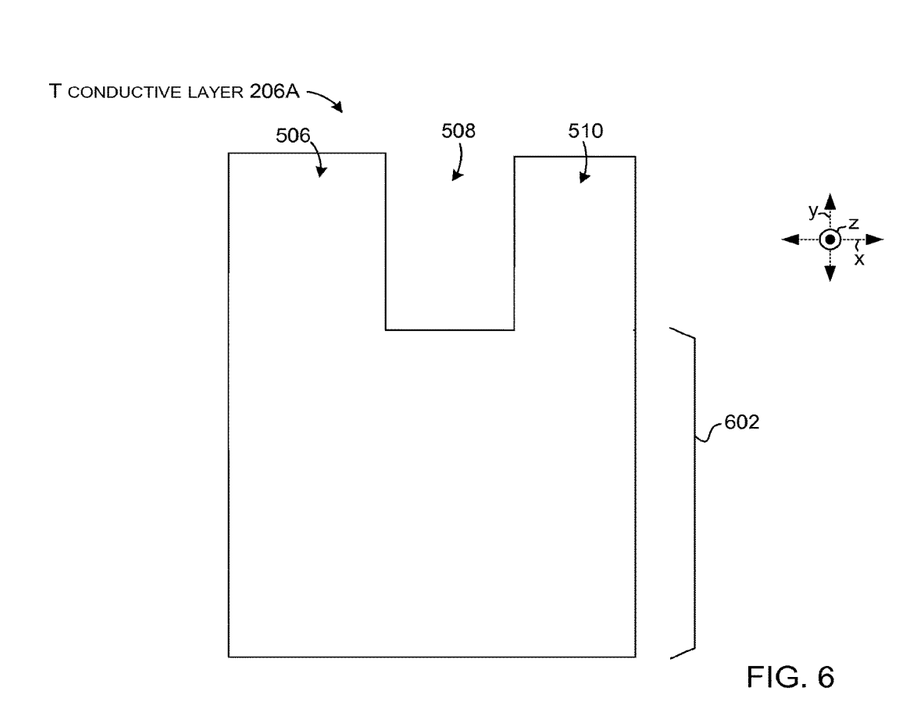
FIGS. 6 and 7 are elevational views of example thermal conductive layer implementations in accordance with the present concepts.
Figure 7:
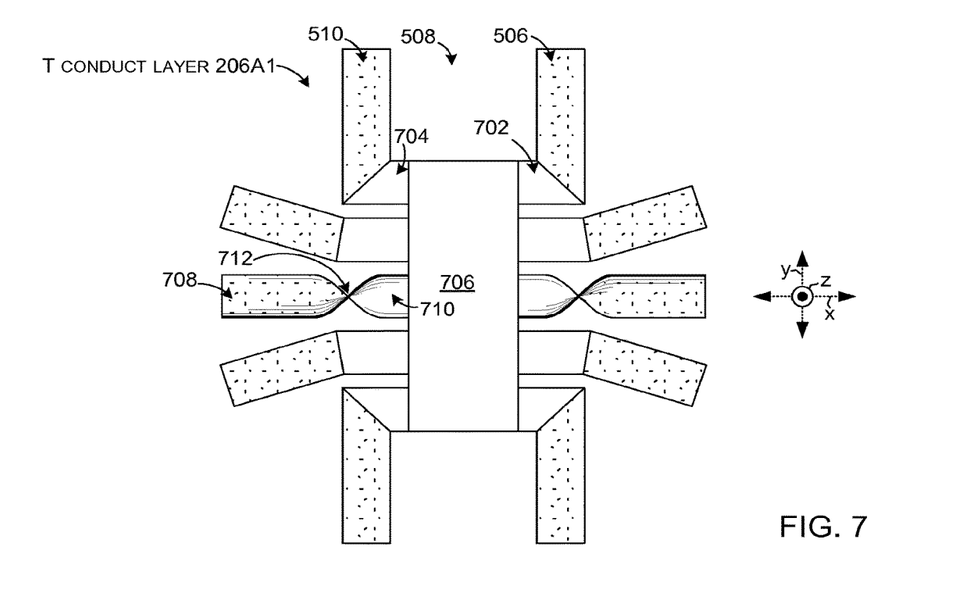

The thermal conductive layer 206A can be positioned over the thermal insulative layer 208A. The thermal conductive layer can be formulated from various materials, such as graphite, pyrolytic graphite, graphene, carbon nanostructures, and/or other organic compounds, etc. In some implementations, the thermal conductive material can be selected from a material that tends to be relatively more efficient at thermal transfer in the x and y reference directions than the z reference direction (e.g., anisotropic). The thermal conductive material can be deposited on the thermal insulative layer 208A such as by spraying or printing. In another implementation the thermal conductive material is manifest as a sheet. Sheet examples are shown in FIGS. 6-7. For discussion purposes, three areas of interest 506, 508, and 510 are designated on FIG. 5. Area 506 underlies GPU 302, area 508 underlies wireless circuitry 304 and area 510 underlies processor 112A (see FIG. 3).

FIG. 6 shows a view of thermal conductive layer 206A along the xy reference plane. In this case, the thermal conductive layer 206A is shaped so that no material of the layer occurs at area 508. Further, areas 506 and 510 occur proximate to heat generating electronic components. The thermal conductive layer 206A can efficiently diffuse heat from these areas to a large area 602 of the layer so that heat is spread throughout a majority of a surface of the device rather than being concentrated near the heat generating electronic components.

FIG. 7 shows an alternative implementation of the thermal conductive layer manifest as an anisotropic thermal conductive layer 206A1. In this case, the anisotropic thermal conductive layer can be manifest as a sheet of material. In this example, material usage can be reduced by shaping the sheet so that portions of the sheet are positioned proximate to the heat generating components (e.g., areas 506 and 510). Additional sheet material 702 and 704 can connect these areas 506 and 510 to a central area 706 that aids in even and widespread heat distribution. Stated another way, the stippled areas of the thermal conductive layer can be utilized as heat gathering areas which transfer heat to the non-stippled heat dissipation areas. Further, twisting of the thermal conductive layer 206A1 can be utilized in this implementation to control movement of heat on the thermal conductive layer 206A1. Recall that some materials, such as pyrolytic graphite, that can be used for thermal conductive layer 206A1 are very efficient at conducting heat in the x and y reference directions and very poor at conducting heat in the z reference direction. This implementation can 'flip' portions of the pyrolytic graphite. Thus, a portion 708 of a first surface (facing away from the reader at 708) of the pyrolytic graphite sheet can be positioned toward a heat generating component (e.g. toward a center of the device) to conduct heat from the heat generating component. Another portion 710 of the pyrolytic sheet can then be flipped or twisted at 712 so that the first surface is facing away from the heat generating component (e.g., toward the outside of the device and in this case toward the reader). Heat that is conducted laterally along the pyrolytic sheet from the surface facing away from the reader at portion 708 can travel along this 'flipped surface' so that it is more readily dissipated to the outside of the device at portion 710 (e.g., to the outer structural layer).

In another application, the heat sources could be centrally located (e.g., positioned under the central area 706 (on the opposite side as the reader)). Heat could be conducted from the heat sources to the central area 706 and then dissipated throughout the surface of the device via the outer portions such as 506, 510, and 708. Further, twisting at 712 can be used so that heat that was captured on the surface of the graphite that was facing away from the reader and toward the heat source is now facing toward the reader and the outer structural layer 204A (see FIG. 5).

Viewed from one perspective, some of the present implementations can take advantage of pyrolytic graphite's (or similar material's) ability to transfer heat in the X-Y plane readily, but not in the Z plane. This can allow for selective delivery of the heat to different surfaces by folding the pyrolytic graphite over within the structure. Selectively cutting and folding can allow a smaller piece of pyrolytic graphite to be utilized to reduce cost. By creating a larger area in the center of the device to fully engage a heat source, and slicing the peripheral portions of the sheet and selectively folding them, an "origami" structure may be formed allowing heat to be moved radially around the center, and transferred from the inner surface to the outer surface farther away from the heat source.

As mentioned above, the pyrolytic graphite can be folded over to expose the hot side to the outer surface of the bucket in a location away from the heat source. Some implementations can employ the so-called "origami" structure where multiple strands and folds of the graphite could allow heat to travel along the inside of the device until a better location to couple to the outside of the device has been reached. At that point, the heated layer is now brought into contact with the outer layer to radiate heat externally to the device.

In the illustrated example, the graphite has 10 equal legs cut into the sides, 5 legs on each side. (Though not illustrated, other geometric configurations are contemplated). The legs can be folded over to expose the side of the pyrolytic graphite that is transmitting heat well in the x-y plane. When this graphite is positioned between the heat source and the rear skin (e.g. outer structural layer) of the device, the heat source would be connected to the pyrolytic graphite, and the heat would be coupled away from the heat source to the outer skin. This would eliminate the hot spot that a customer might otherwise perceive at a specific area of the outer skin by distributing this heat evenly.

Figure 8:
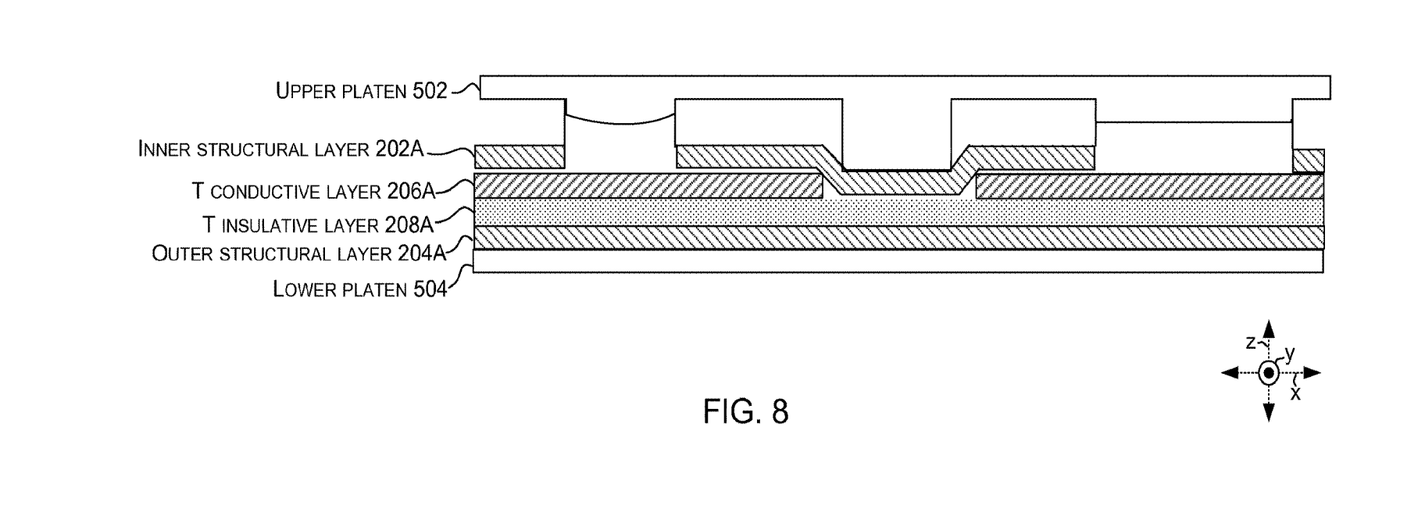

FIG. 8 continues from FIG. 5. At this point, the inner structural layer 202A is positioned over (e.g., against) the thermal conductive layer 206A and the upper platen 502 is positioned over (e.g., against) inner structural layer 202A. Further, at this point, conditions can be created to cause thermal insulative layer 208A to expand. For instance, the temperature can be increased for a period of time to cause the thermal insulation to expand and cure into a relatively rigid bonding state. The conditions can be dictated by the specific thermal insulative layer composition utilized. The thermal insulative layer manufacturer can provide guidance to the conditions for their product.

Figure 9:
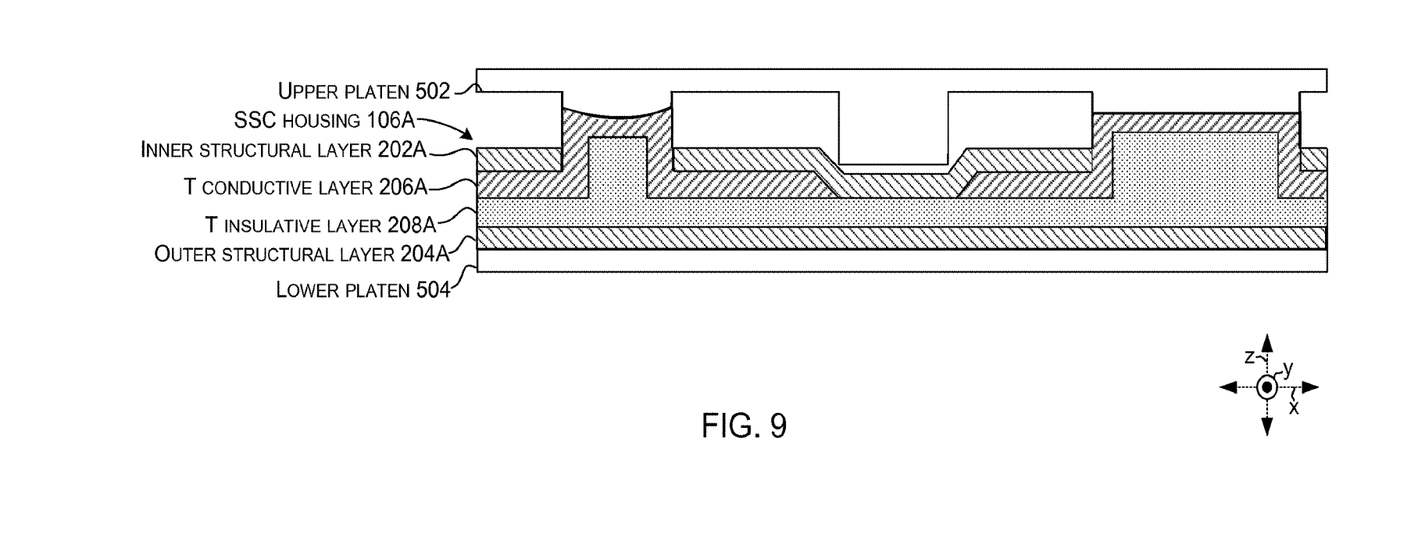

FIG. 9 shows the results after the expansion of the thermal insulative layer 208A forces the thermal conductive layer 206A up against the upper platen 502 to form the sandwich structured composite housing 106A. Thus, the thermal insulative layer has expanded and is now cured so that it provides bonding properties to secure the outer structural layer 204A, the thermal conductive layer 206A, and the inner structural layer 202A together as a 'sandwich structured composite' that has a collective strength greater than any of the individual elements. To summarize, the thermal insulative layer can be selected from materials that when exposed to certain conditions, such as heat, the materials tend to expand. These conditions and/or other conditions can cause the material to cure to a state where the material functions as an adhesive. For instance, heating may cause the material to expand and then cooling the material may cause the material to cure and adhere to the surrounding materials.

Figure 10:
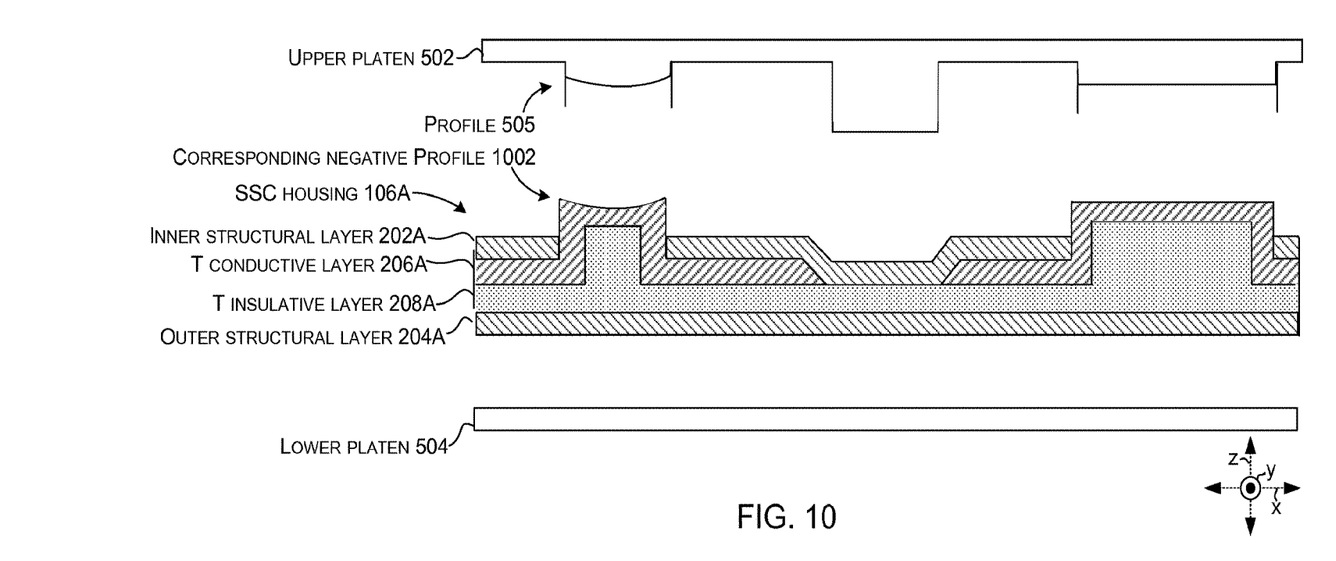
Figure 11:
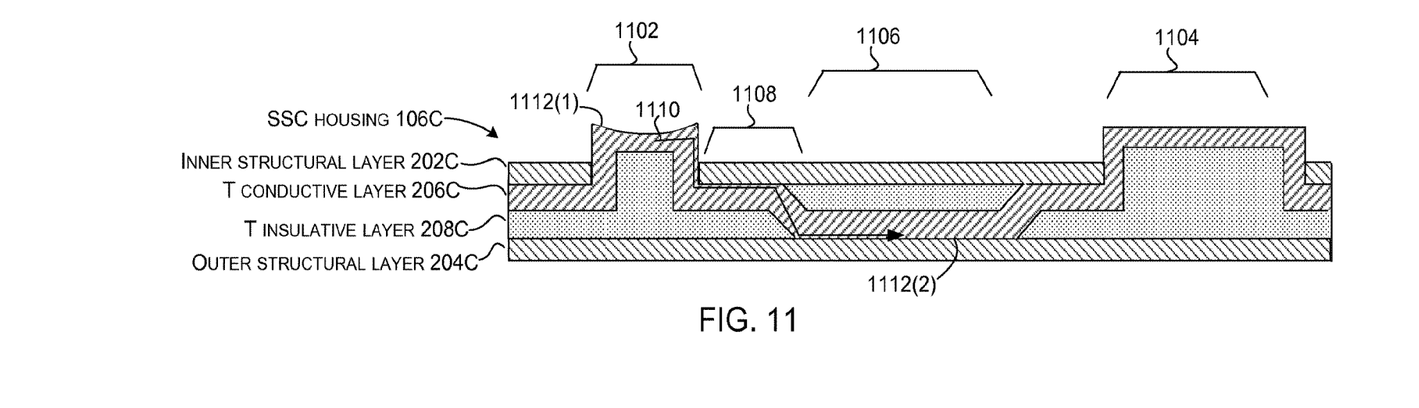

FIG. 10 shows the upper and lower platens 502 and 504 removed from the resultant sandwich structured composite housing 106A. Note how a profile 1002 of the resultant sandwich structured composite housing 106A can be thought of as a corresponding negative profile to the profile 505 of the upper platen (which itself mimics the profile of the heat generating electronic components (see the discussion above related to FIG. 5). Thus, profile 1002 can be termed a 'corresponding negative profile'. Note that the corresponding negative profile 1002 does not have to be an exact negative of the profile 505 but can be an approximate negative profile of at least a portion of profile 505. More specifically, the negative profile can correspond to electronic components that produce relatively large amounts of heat.

FIG. 11 shows an alternative version of a similar sandwich structured composite housing 106C. In this implementation, in areas 1102 and 1104 proximate to heat generating components (See 302 and 112A of FIG. 3) the thermal conductive layer 206C is positioned above the thermal insulative layer 208C (e.g., the thermal insulative layer 208C is closer to the outer structural layer 204C than is the thermal conductive layer 206C). In another area 1106, the thermal conductive layer 206C is below thermal insulative layer 208C (e.g., closer to the outer structural layer 204C). This configuration can allow the thermal conductive layer 206C to be proximate to the heat generating components to pick up heat and then be proximate to the outer structural layer 204C to dissipate the heat. This configuration also lends itself to the 'flipped' thermal conductive layer configuration described above relative to FIG. 7. For instance, the thermal conductive layer could be flipped 180 degrees in an intervening area 1108. As such, as indicated by arrow 1110, heat can be picked up on an upward facing surface 1112(1) of the thermal conductive layer 206C proximate to the heat generating component. The heat can travel laterally along the thermal conductive layer. Upon flipping, the upper facing surface 1112(2) becomes a downward facing surface that positions the captured heat against the outer structural layer 204A to be readily dissipated.

Figure 12:
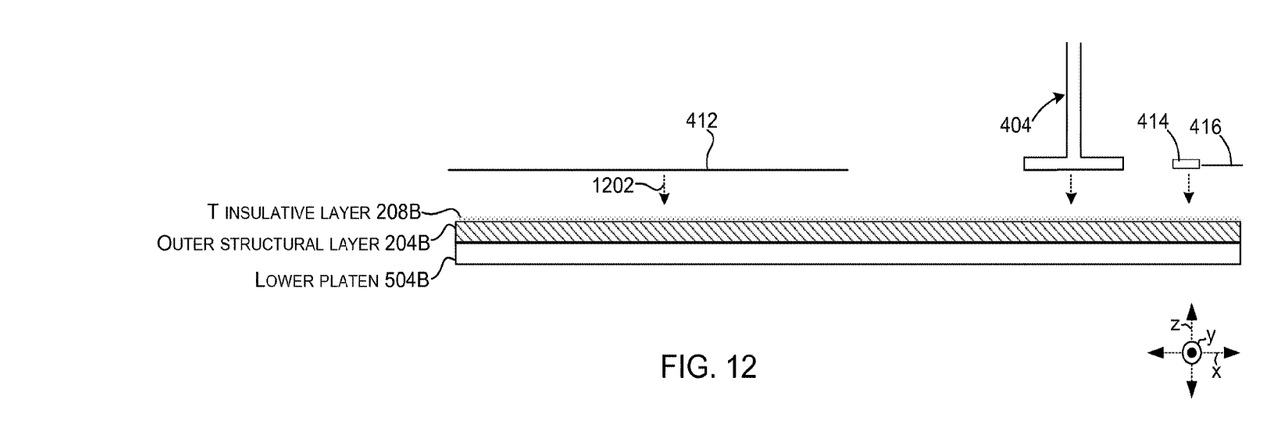
Figure 13:
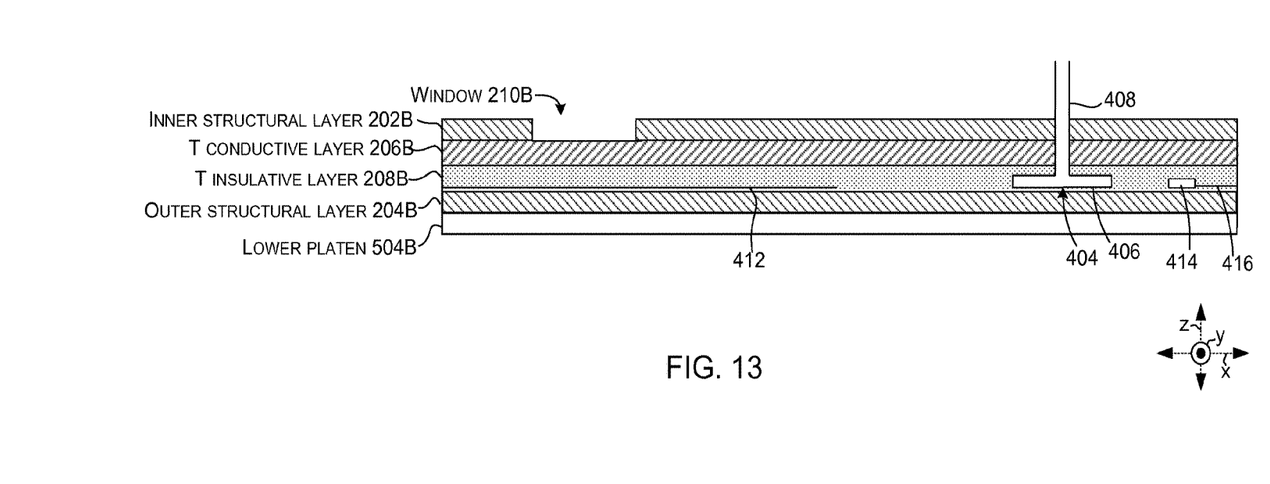
Figure 14:
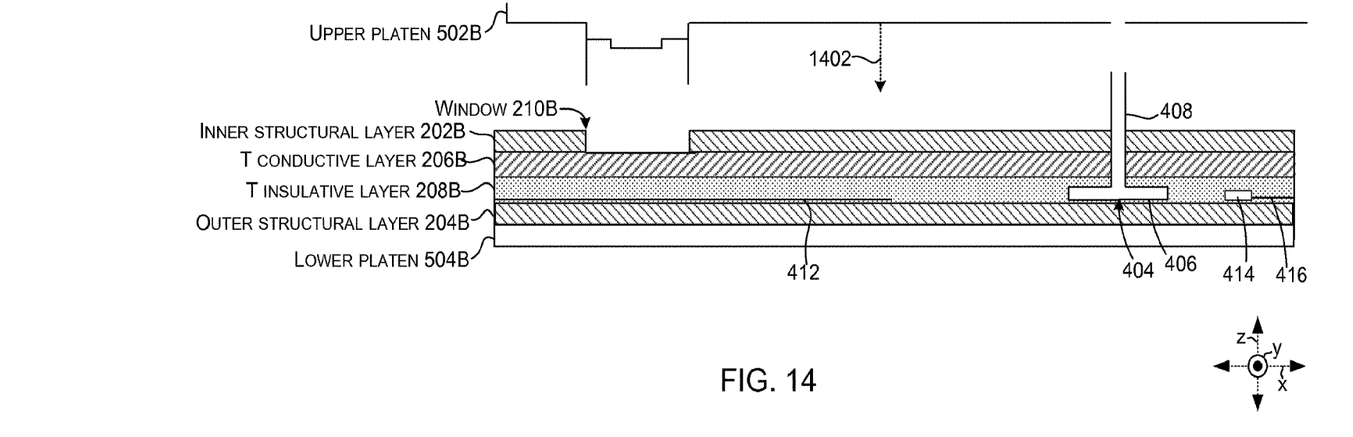
Figure 15:
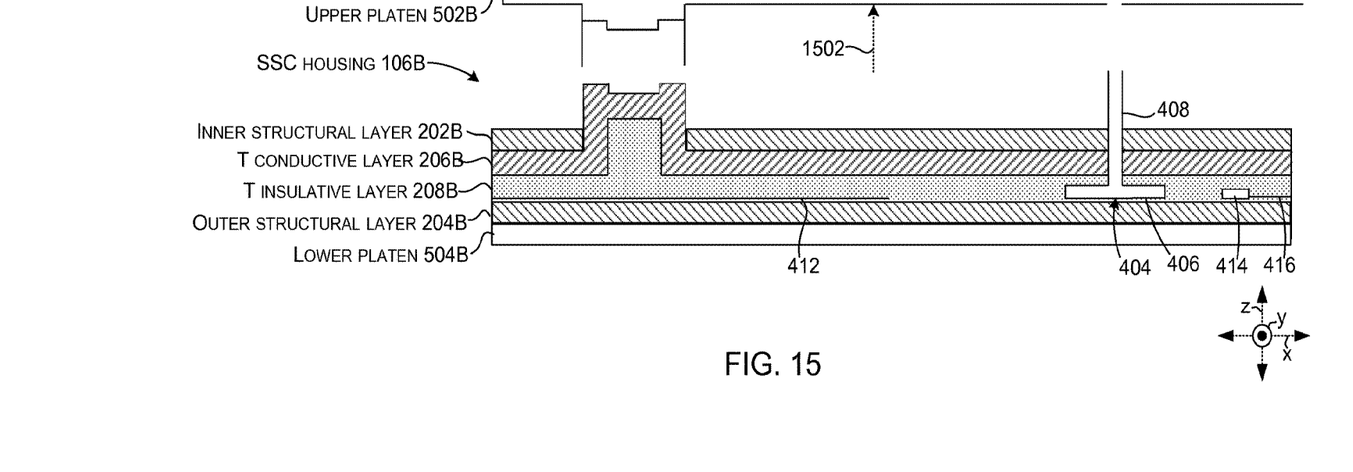

FIGS. 12-15 show an assembly process for sandwich structured composite housing 106B (labeled in completed form in FIG. 15). FIG. 12 shows outer structural layer 204B positioned on lower platen 504B. A thin layer of thermal insulative layer 208B can be positioned on outer structural layer 204B. The structural component 404 and electronic components 412, 414, and 416 can be positioned and/or formed on the thermal insulative layer 208 as indicated by arrows 1202.

FIG. 13 shows additional thermal insulative layer 208B positioned over the existing thin layer. The thermal conductive layer 206B can be positioned over the thermal insulative layer 208B. The inner structural layer 202B can be positioned over the thermal conductive layer 206B. Note that window 210B is formed in inner structural layer 202B directly under the location of processor 112B (see FIG. 4).

FIG. 14 shows that the upper platen 502B can be positioned over the inner structural layer 202B as indicated by arrow 1402.

FIG. 15 shows the resultant sandwich structured composite housing 106B after exposure to conditions that cause the thermal insulative layer 208B to expand and force the thermal conductive layer through the window 210 (see FIG. 13). At this point, the upper platen 502B is being lifted upward as indicated by arrow 1502. Also at this point, the sandwich structured composite housing 106B is ready for the removal of the lower platen 504B and is ready to receive the printed circuit board 116B and upper portion 104B (see FIG. 4).

Some implementations of the sandwich structured composite housing 106B work by increasing the in-plane thermal conductivity and reducing the Z-direction thermal conductivity. The inner and outer structural layers can serve as the structural component of the sandwich structured composite housing. The thickness and material can be tailored to a variety of thicknesses and materials depending upon the specific situation. The thermal conductive layer can be used to increase the thermal conductivity in-plane of the bucket and can be tailored to meet the specific needs of a given application. It can be used over the entire surface or only in specific areas as dictated by the system's heat generating components and its thickness and conductivity can be adjusted as needed. The insulative layer can be used to reduce the thermal conductivity which will increase the thermal resistance. The material and thickness of the insulative layer can be tailored to meet the specific application's needs. Increasing the thermal resistance between the heat generating components and the skin will tend to reduce the temperature of the skin while increasing the temperature of the components. Because skin temperature is generally the overriding factor and not component temperature, increasing the resistance of this path can allow running more power (and thus get more performance) to the heat generating components and operate at a more optimal balance of skin and component temperatures. An additional benefit is that all of this can be achieved in the same thickness budget as current solutions and at a lower weight than current solutions. Using this technology will tend to reduce the thermal limitations on operating power and could allow for higher-performance machines and a more comfortable user experience.

The present bonding concepts can be utilized with various types of devices, such as computing devices that can include but are not limited to notebook computers, foldable tablet type computers, bent and bendable devices, smart phones, wearable smart devices, gaming devices, entertainment consoles, rigid devices, flexible devices, home and enterprise appliances, automobiles, machinery, and/or other developing or yet to be developed types of devices. As used herein, a computing device can be any type of device that has some amount of processing and/or storage capacity. A mobile computing device can be any computing device that is intended to be readily transported by a user.

Additional Examples

Various device examples are described above. Additional examples are described below. One example is manifest as a device that includes a metal composite material housing comprising inner and outer structural layers. The example can also include interposed thermal insulative and thermal conductive layers and components positioned over windows in the inner structural layer and the thermal conductive layer extending from between the inner and outer layers through the windows toward the components.

Any combination of the above and/or below examples where the components are electronic components.

Any combination of the above and/or below examples where the electronic components are heat generating electronic components and/or wherein the electronic components do not generate heat.

Any combination of the above and/or below examples where the metal composite material housing defines a generally planar region, and wherein the heat generating electronic components are positioned over the generally planar region.

Any combination of the above and/or below examples where a shape of an individual window corresponds to a shape of an individual heat generating electronic component positioned over the individual window when viewed through the generally planar region.

Any combination of the above and/or below examples where the thermal conductive layer occurs on an entirety of the generally planar region, or wherein the thermal conductive layer is selectively arranged on the generally planar region.

Any combination of the above and/or below examples where an individual electronic component has a profile over an individual window when viewed along the planar region and wherein a portion of the thermal conductive layer extending through the individual window has a corresponding negative profile.

Any combination of the above and/or below examples where the thermal conductive layer is more efficient at conveying thermal energy parallel to the planar region than perpendicular to the planar region.

Any combination of the above and/or below examples where the thermal conductive layer comprises a sheet.

Any combination of the above and/or below examples where the thermal conductive layer comprises graphite, graphene or a carbon nanostructure.

Any combination of the above and/or below examples further comprising additional electronics positioned between the inner and outer structural layers.

Any combination of the above and/or below examples where the additional electronics comprise traces, sensors, or antennas.

Any combination of the above and/or below examples further comprising a structural member embedded in the thermal insulative layer and extending through the inner structural layer.

Another example is manifest as a computing device that includes a sandwich structured composite housing and a set of electronic components positioned over the sandwich structured composite housing. The set of electronic components having a profile against the sandwich structured composite housing, and the sandwich structured composite housing having a corresponding negative profile.

Any combination of the above and/or below examples where the sandwich structured composite housing comprises a metal composite material.

Any combination of the above and/or below examples further comprising a touch display and wherein the set of electronic components are positioned between the sandwich structured composite housing and the touch display.

Any combination of the above and/or below examples further comprising another housing and wherein the set of electronic components are positioned between the sandwich structured composite housing and the another housing.

Any combination of the above and/or below examples where the sandwich structured composite housing comprises an outer structural layer, a thermal insulative layer, a thermal conductive layer, and an inner structural layer.

Any combination of the above and/or below examples where the thermal conductive layer comprises a continuous sheet.

Any combination of the above and/or below examples where a majority of an area of the sheet is positioned between the inner structural layer and the outer structural layer, and wherein a minority of the area of the sheet is proud of the inner structural layer.

Another example is manifest as a sandwich structured composite housing that includes an inner structural layer defining a window and an outer structural layer. The example also includes an anisotropic thermal conductive layer, a first area of the thermal conductive layer positioned between the inner structural layer and the outer structural layer and a second area of the thermal conductive layer extending through the window beyond the inner structural layer. The example further includes a thermal insulative layer bonding the inner structural layer, the anisotropic thermal conductive layer, and the outer structural layer.

Any combination of the above and/or below examples where a majority of an area of the sheet is positioned between the inner structural layer and the outer structural layer, and wherein a minority of the area of the sheet is proud of the inner structural layer.

Any combination of the above and/or below examples where the anisotropic thermal conductive layer is generally continuous or is origami shaped.

CONCLUSION

Although techniques, methods, devices, systems, etc., pertaining to sandwich structure composite housings are described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:

1. A device, comprising:
   a sandwich structured composite housing;
   a touch display; and,
   a set of electronic components positioned between the sandwich structured composite housing and the touch display, the set of electronic components having a profile against the sandwich structured composite housing, and the sandwich structured composite housing having a negative profile that corresponds to the profile of the set of electronic components.

2. The device of claim 1, wherein the sandwich structured composite housing comprises a metal composite material.

3. The device of claim 1, further comprising another housing that houses the touch display.

4. A device comprising:
   a sandwich structured composite housing comprising an outer layer, a thermal insulative layer, a thermal conductive layer, and an inner structural layer; and,
   a set of electronic components positioned over the sandwich structured composite housing, the set of electronic components having a profile against the sandwich structured composite housing, and the sandwich structured composite housing having a negative profile that corresponds to the profile of the set of electronic components.

5. The device of claim 4, wherein the thermal conductive layer comprises a continuous sheet.

6. The device of claim 5, wherein a majority of an area of the continuous sheet is positioned between the inner structural layer and the outer structural layer, and wherein a minority of the area of the continuous sheet is not positioned between the inner structural layer and the outer structural layer.

7. The device of claim 4, wherein the negative profile is defined by the thermal conductive layer.

8. The device of claim 4, wherein the inner structural layer defines a window, an individual one of the electronic components being positioned over the window, and the thermal conductive layer extends from a lower side of the inner structural layer through the window toward the individual one of the electronic components.

9. A device, comprising:
a composite material housing comprising inner and outer structural layers and a thermal conductive layer, the thermal conductive layer being at least partly interposed in an area between the inner and outer structural layers, the inner structural layer defining a window; and,
an electronic component positioned over the window in the inner structural layer, the thermal conductive layer extending from a lower side of the inner structural layer through the window toward the electronic component, the electronic component having a profile over the window, and wherein the thermal conductive layer has a negative profile that corresponds to the profile of the electronic component.

10. The device of claim 9, further comprising a thermal insulative layer being partly interposed in the area between the inner and outer structural layers.

11. The device of claim 9, wherein the inner structural layer further defines an additional window, and the device further comprises additional electronic component positioned over the additional window.

12. The device of claim 9, wherein the profile of the electronic component over the window is curved.

13. The device of claim 9, wherein the profile of the electronic component over the window is convex and the negative profile of the thermal conductive layer is concave.

14. The device of claim 9, wherein the profile of the electronic component over the window is non-planar.

15. The device of claim 9, wherein the profile of the electronic component and the negative profile of the thermal conductive layer allow a gap between the electronic component and the thermal conductive layer.

16. The device of claim 9, wherein an upper surface of the inner structural layer is shaped to accommodate an additional electronic component positioned over the inner structural layer.

17. The device of claim 16, wherein the upper surface of the inner structural layer includes an indentation to accommodate the additional electronic component.

18. A device, comprising:
a sandwich structured composite housing including a thermal conductive layer and an insulative layer; and,
a set of electronic components positioned over the sandwich structured composite housing, the set of electronic components having a profile against a first side of the thermal conductive layer, the first side of the thermal conductive layer having a corresponding negative profile against the profile of the set of the electronic components, and the insulative layer positioned against an opposing second side of the thermal conductive layer.

19. The device of claim 18, wherein the thermal conductive layer comprises an anisotropic material.

20. The device of claim 18, wherein the thermal conductive layer is configured to transfer heat energy away from the electronic components.

21. The device of claim 18, wherein the opposing second side of the thermal conductive layer has a nonlinear profile that fits a corresponding nonlinear profile of the insulative layer.

* * * * *